(12) United States Patent
Hall et al.

(10) Patent No.: US 9,660,168 B2
(45) Date of Patent: May 23, 2017

(54) HEAT EXCHANGER FOR THERMOELECTRIC POWER GENERATION WITH THE THERMOELECTRIC MODULES IN DIRECT CONTACT WITH THE HEAT SOURCE

(71) Applicant: Board of Regents, The University of Texas System, Austin, TX (US)

(72) Inventors: Matthew J. Hall, Austin, TX (US); Li Shi, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 320 days.

(21) Appl. No.: 14/505,068

(22) Filed: Oct. 2, 2014

(65) Prior Publication Data
US 2016/0233404 A1 Aug. 11, 2016

Related U.S. Application Data

(60) Provisional application No. 61/892,767, filed on Oct. 18, 2013.

(51) Int. Cl.
*H01L 35/32* (2006.01)
*H01L 35/30* (2006.01)
*F01N 5/02* (2006.01)

(52) U.S. Cl.
CPC ............. *H01L 35/32* (2013.01); *H01L 35/30* (2013.01); *F01N 5/025* (2013.01)

(58) Field of Classification Search
CPC ......... H01L 35/32; H01L 35/30; F01N 5/025; F28F 3/02
See application file for complete search history.

(56) References Cited

U.S. PATENT DOCUMENTS

2003/0094265 A1 5/2003 Chu et al.
2006/0157102 A1 7/2006 Nakajima et al.
(Continued)

OTHER PUBLICATIONS

Search Report and Written Opinion for International Application No. PCT/US2014/058841 dated Jan. 6, 2015, pp. 1-10.
(Continued)

*Primary Examiner* — Devina Pillay
(74) *Attorney, Agent, or Firm* — Robert A. Voigt, Jr.; Winstead, P.C.

(57) ABSTRACT

A thermoelectric power generator for converting thermal energy into electrical energy. The thermoelectric power generator includes a heat exchanger configured to extract thermal energy from an exhaust gas stream. The heat exchanger includes fins in contact with a boundary of the heat exchanger, where the fins are directly connected to a first set of thermoelectric modules. A second set of thermoelectric modules are directly connected to the boundary of the heat exchanger. The first and second sets of thermoelectric modules are configured to convert the thermal energy to electrical energy. By eliminating the metal wall that previously existed between the thermoelectric modules and the fins, the thermoelectric power generator improves the heat transfer between the exhaust gas and the thermoelectric modules, eliminates the thermal fatigue failures at the bond between the metal wall and the thermoelectric modules as well as allows for a higher density of thermoelectric modules.

21 Claims, 3 Drawing Sheets

(56) References Cited

U.S. PATENT DOCUMENTS

| | | |
|---|---|---|
| 2006/0225448 A1 | 10/2006 | Feger et al. |
| 2007/0181294 A1* | 8/2007 | Soldner ................. F28D 9/0031 |
| | | 165/175 |
| 2009/0056928 A1* | 3/2009 | Jiang .................. F28D 15/0233 |
| | | 165/182 |
| 2009/0151768 A1 | 6/2009 | Forseth |
| 2011/0113767 A1 | 5/2011 | Richter |
| 2011/0155202 A1 | 6/2011 | Arnold et al. |
| 2012/0073276 A1 | 3/2012 | Meisner et al. |
| 2013/0000285 A1* | 1/2013 | Prior ................... B23K 1/0012 |
| | | 60/320 |
| 2013/0068213 A1 | 3/2013 | Forseth |
| 2013/0152561 A1* | 6/2013 | An .......................... F01N 5/025 |
| | | 60/320 |
| 2013/0206200 A1 | 8/2013 | Khuc |
| 2013/0319492 A1 | 12/2013 | Richter |
| 2013/0340801 A1 | 12/2013 | Zhang et al. |
| 2014/0034102 A1 | 2/2014 | Ranalli et al. |

OTHER PUBLICATIONS

International Preliminary Report on Patentability for International Application No. PCT/US2014/058841 dated Apr. 19, 2016, pp. 1-9.

\* cited by examiner

HEAT EXCHANGER FOR THERMOELECTRIC POWER GENERATION WITH THE THERMOELECTRIC MODULES IN DIRECT CONTACT WITH THE HEAT SOURCE

CROSS REFERENCE TO RELATED APPLICATIONS

This application is related to the following commonly owned U.S. Patent Application:

Provisional Application Ser. No. 61/892,767, "A Heat Exchanger for Thermoelectric Power Generation with the Thermoelectric Modules in Direct Contact with the Heat Source," filed Oct. 18, 2013, and claims the benefit of its earlier filing date under 35 U.S.C. §119(e).

GOVERNMENT INTERESTS

The U.S. Government has certain rights in this invention pursuant to the terms of the National Science Foundation Grant No. CBET-1048767.

TECHNICAL FIELD

The present invention relates generally to heat exchangers, and more particularly to a heat exchanger for thermoelectric power generation with the thermoelectric modules in direct contact with the heat source.

BACKGROUND

A heat exchanger is a piece of equipment for efficient heat transfer from one medium to another. One such heat exchanger is a heat exchanger for thermoelectric power generation as illustrated in FIG. 1. Referring to FIG. 1, FIG. 1 illustrates a conventional thermoelectric power generator 100 that includes an exhaust gas heat exchanger 101. Exhaust gas heat exchanger 101 is defined by an exhaust housing/wall 102, such as an aluminum exhaust housing. Exhaust gas heat exchanger 101 receives a pressurized exhaust gas stream 103 from an internal combustion engine 104 and extracts thermal energy from exhaust gas stream 103.

Exhaust gas heat exchanger 101 may include a flange (not shown) to sealingly connect to an exhaust pipe (not shown) of internal combustion engine 104. The flange and wall 102 may be formed from a single piece, by, for example, upsetting. Alternatively, the flange may be attached to wall 102 by welding, brazing, or crimping. It is to be understood that the exhaust gas stream 103 from internal combustion engine 104 is at a higher pressure than the ambient atmosphere when the engine 104 is running and the pressurized exhaust gas stream 103 is contained in an exhaust system.

Exhaust gas heat exchanger 101 may include fins 105A-105R (e.g., aluminum fins) that are in contact with wall 102 to increase the rate of heat transfer from exhaust gas stream 103. Fins 105A-105R may collectively or individually be referred to as fins 105 or fin 105, respectively.

Thermoelectric power generator 100 further includes thermoelectric device modules 106 with their hot-side connected to wall 102. Thermoelectric device modules 106 are configured to convert the thermal energy extracted by heat exchanger 101 to electrical energy 107 for consumption or storage by an electrical load 108 (e.g., batteries, electric motors, fans).

Furthermore, thermoelectric power generator 100 includes liquid cooled heat exchangers 109A, 109B disposed on the cold-side of thermoelectric device modules 106 to transfer the thermal energy from thermoelectric device modules 106 to a liquid coolant (e.g., water) passed through liquid cooled heat exchangers 109A, 109B.

Currently, conventional thermoelectric power generators, such as disclosed in FIG. 1, utilize a metal wall, such as wall 102. However, by utilizing such a metal wall, there exists thermal contact resistance between metal wall 102 and the hot-side of thermoelectric device modules 106. As a result, conduction losses occur thereby lessening the effectiveness of the thermal energy transferred to thermoelectric device modules 106 from heat exchanger 101.

Furthermore, a source of failure for conventional thermoelectric power generators occurs at the bond between the metal wall, such as wall 102, and the hot-side of the thermoelectric device modules, such as modules 106. Such a failure occurs because of the large differences in the coefficient of thermal expansion between the metal wall and the ceramic materials used on the hot-side of the thermoelectric device modules thereby resulting in thermal fatigue failure of the bond between the wall and the thermoelectric device modules.

As a result, such conventional thermoelectric power generators are subject to conduction losses and thermal fatigue failures.

BRIEF SUMMARY

In one embodiment of the present invention, a thermoelectric power generator comprises a heat exchanger configured to extract thermal energy from an exhaust gas stream, where the heat exchanger comprises a first plurality of fins in contact with a boundary of the heat exchanger, where the first plurality of fins are directly connected to a first plurality of thermoelectric device modules. The heat exchanger further comprises a second plurality of thermoelectric device modules directly connected to the boundary of the heat exchanger. The first and second plurality of thermoelectric device modules are configured to convert the thermal energy to electrical energy.

In another embodiment of the present invention, a thermoelectric power generator system comprises an internal combustion engine configured to generate an exhaust gas stream through an exhaust pipe. The system further comprises a thermoelectric power generator connected to the internal combustion engine via the exhaust pipe. Additionally, the system comprises an electrical load connected to the thermoelectric power generator. The thermoelectric power generator comprises a heat exchanger configured to extract thermal energy from an exhaust gas stream, where the heat exchanger comprises a first plurality of fins in contact with a boundary of the heat exchanger, where the first plurality of fins are directly connected to a first plurality of thermoelectric device modules. The heat exchanger further comprises a second plurality of thermoelectric device modules directly connected to the boundary of the heat exchanger. The first and second plurality of thermoelectric device modules are configured to convert the thermal energy to electrical energy.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which.

DETAILED DESCRIPTION

While the following discusses the present invention in connection with thermoelectric power generators implementing a single housing, the principles of the present invention may be applied to thermoelectric power generators implementing multiple housings. A person of ordinary skill in the art would be capable of applying the principles of the present invention to such implementations. Further, embodiments applying the principles of the present invention to such implementations would fall within the scope of the present invention.

Figure 1:
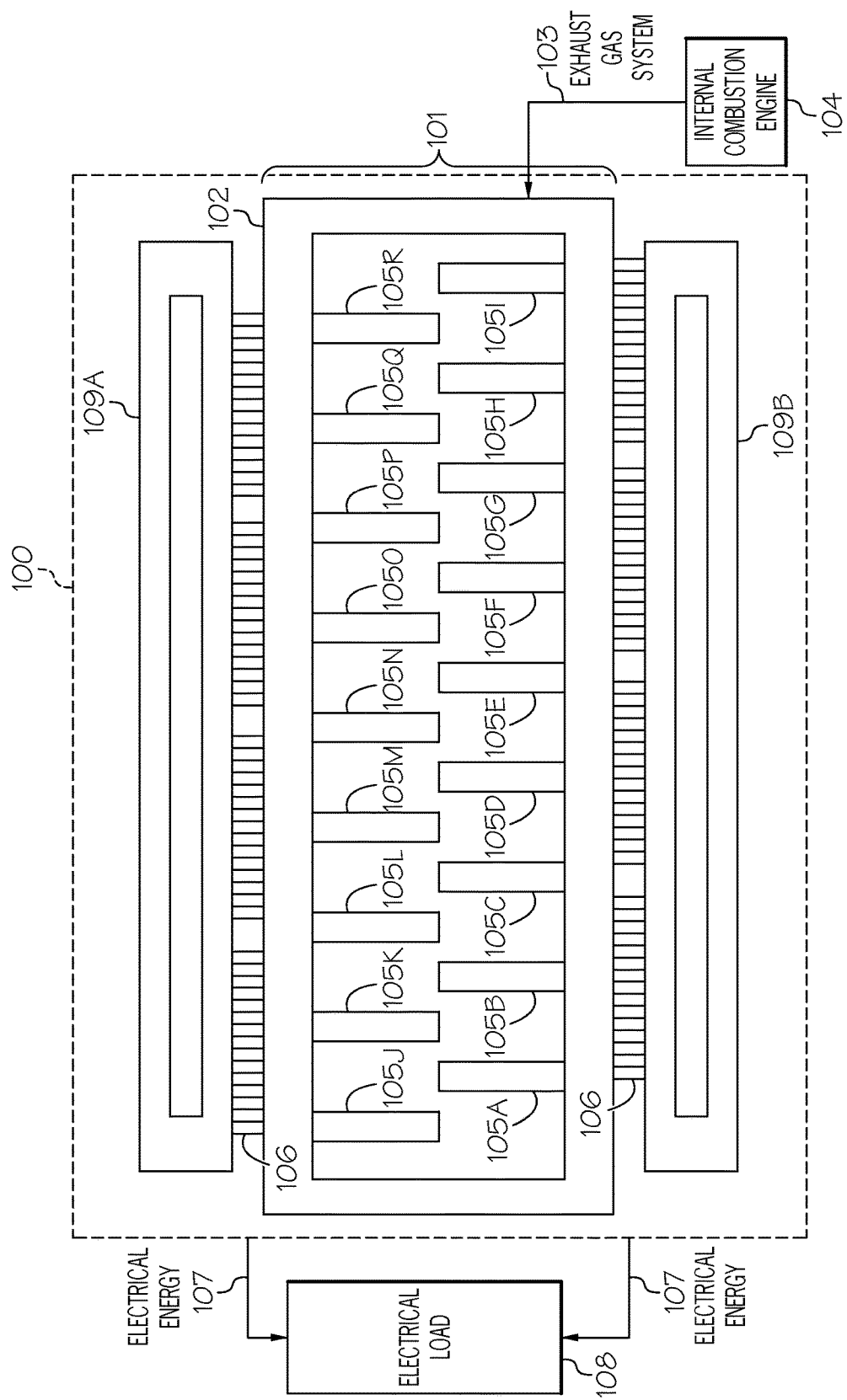
FIG. 1 illustrates a conventional thermoelectric power generator.

As stated in the Background section, currently, conventional thermoelectric power generators, such as shown in FIG. 1, utilize a metal wall, such as wall 102. Referring to FIG. 1, by utilizing such a metal wall, there exists thermal contact resistance between metal wall 102 and the hot-side of thermoelectric device modules 106. As a result, conduction losses occur thereby lessening the effectiveness of the thermal energy transferred to thermoelectric device modules 106 from heat exchanger 101. Furthermore, a source of failure for conventional thermoelectric power generators occurs at the bond between the metal wall, such as wall 102, and the hot-side of the thermoelectric device modules, such as modules 106. Such a failure occurs because of the large differences in the coefficient of thermal expansion between the metal wall and the ceramic materials used on the hot-side of the thermoelectric device modules thereby resulting in thermal fatigue failure of the bond between the wall and the thermoelectric device modules. As a result, such conventional thermoelectric power generators are subject to conduction losses and thermal fatigue failures.

The present invention provides a thermoelectric power generator that improves the effectiveness of the thermal energy transferred to the thermoelectric device modules from the exhaust gas heat exchanger by removing the metal wall thereby eliminating the conduction losses that were occurring. Furthermore, the thermoelectric power generator of the present invention provides a means for reducing the source of thermal fatigue failure by eliminating the metal wall thereby improving the durability of the thermoelectric power generator. Additionally, the thermoelectric power generator of the present invention allows for a higher density of thermoelectric device modules in a given thermoelectric power generator volume thereby allowing for greater electric power production for a given generator volume or size. In addition, the design of the thermoelectric power generator of the present invention is contained in a single housing as opposed to multiple housings, such as three housings as shown in FIG. 1, thereby reducing the cost in manufacturing the thermoelectric power generator. The thermoelectric power generator of the present invention that encompasses such benefits is discussed below in connection with FIG. 2.

Figure 2:
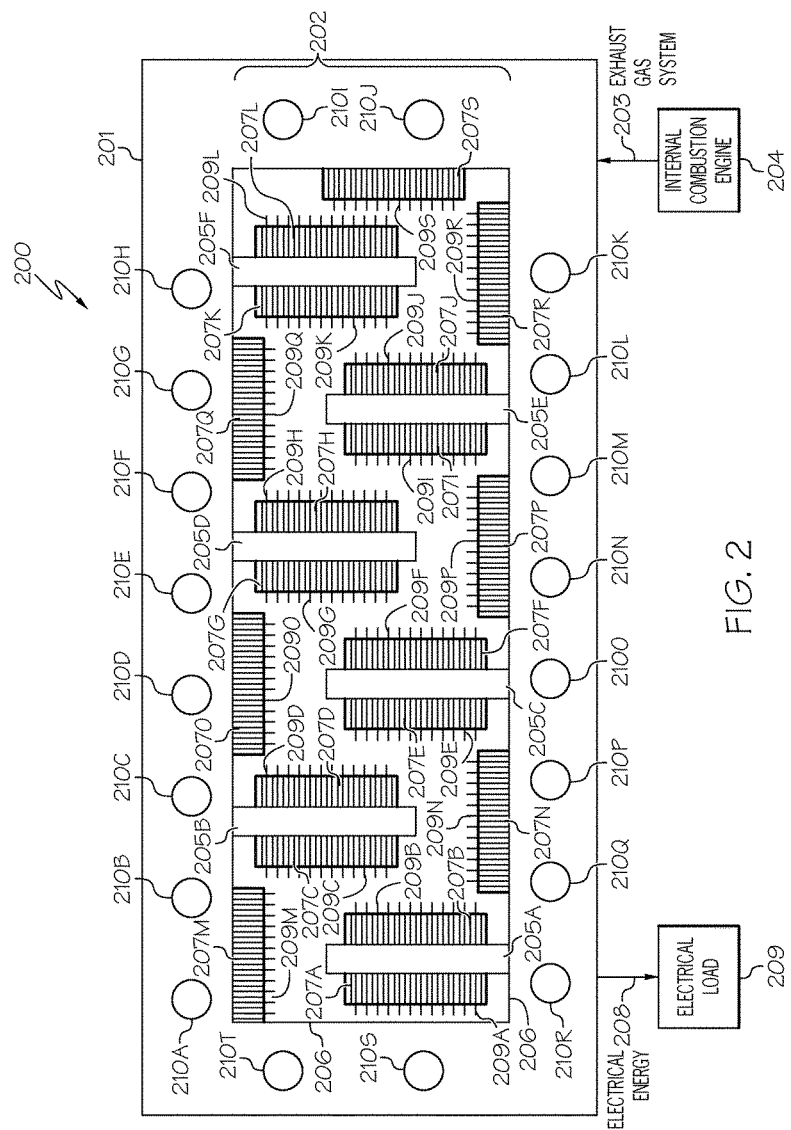
FIG. 2 illustrates a thermoelectric power generator that eliminates the metal wall between the thermoelectric device modules and the fins in accordance with an embodiment of the present invention.

Referring to FIG. 2, FIG. 2 illustrates a thermoelectric power generator 200 that is defined by an exhaust housing 201, such as an extruded aluminum exhaust housing. In one embodiment, the cross-section of exhaust housing 201 is approximately 15 cm×30 cm. Thermoelectric power generator 200 includes a heat exchanger 202 that receives a pressurized exhaust gas stream 203 from an internal combustion engine 204 and extracts thermal energy from exhaust gas stream 203.

In one embodiment, housing 201 may include a flange (not shown), such as a stainless steel flange, to sealingly connect to an exhaust pipe (not shown), such as a stainless steel exhaust pipe, of internal combustion engine 204. In one embodiment, the flange and housing 201 may be formed from a' single piece, by, for example, upsetting. Alternatively, the flange may be attached to housing 201 by welding, brazing, or crimping. It is to be understood that the exhaust gas stream 203 from internal combustion engine 204 is at a higher pressure than the ambient atmosphere when the engine 204 is running and the pressurized exhaust gas stream 203 is contained in an exhaust system.

Heat exchanger 202 may include fins 205A-205F (e.g., aluminum fins) that are in contact with a boundary 206 within heat exchanger 202. Fins 205A-205F may collectively or individually be referred to as fins 205 or fin 205, respectively. While FIG. 2 illustrates fins 205A-205F, heat exchanger 202 may include any number of fins 205 and the heat exchanger of the present invention is not to be limited in scope to the depicted number of fins 205. In one embodiment, fins 205 are utilized in heat exchanger 202 to increase the rate of heat transfer from exhaust gas stream 203.

Heat exchanger 202 further includes thermoelectric device modules 207A-207S directly connected to either fins 205 or boundary 206. Thermoelectric device modules 207A-207S may collectively or individually be referred to as thermoelectric device modules 207 or thermoelectric device module 207, respectively. While FIG. 2 illustrates thermoelectric device modules 207A-207S, heat exchanger 202 may include any number of thermoelectric device modules 207 and the heat exchanger of the present invention is not to be limited in scope to the depicted number of thermoelectric device modules 207. A thermoelectric device module 207, as used herein, is comprised of multiple thermoelectric device elements that are housed within module 207. Each thermoelectric device element is comprised of thermoelectric materials that are bonded to electrical interconnects which are bonded to a non-electrically conductive housing of module 207.

In one embodiment, thermoelectric device modules 207 are configured to convert the thermal energy extracted by heat exchanger 202 to electrical energy 208 for consumption or storage by an electrical load 209 (e.g., batteries, electric motors, fans). In one embodiment, the cold-side of thermoelectric device modules 207 are connected to fins 205 and boundary 206.

Figure 3:
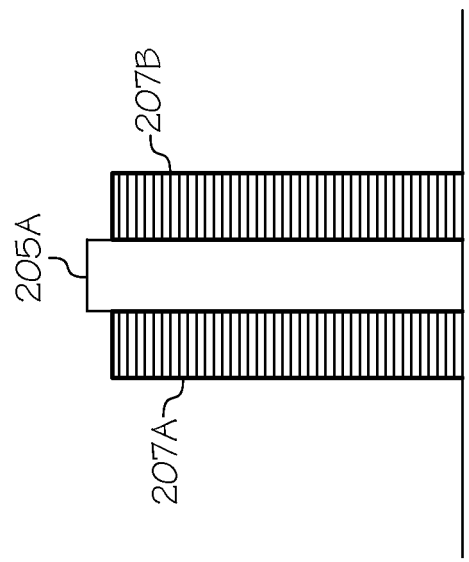
FIG. 3 illustrates thermoelectric device modules being connected to a fin in accordance with an embodiment of the present invention.

In one embodiment, as illustrated in FIG. 2, a portion of thermoelectric device modules 207 are directly connected to fins 205 without a metal wall separating thermoelectric device modules 207 from fins 205. For example, thermoelectric device modules 207A-207L are directly connected to fins 205A-205F as shown in FIG. 2. A close-up view of thermoelectric device module 207 being connected to fin 205 is shown in FIG. 3. FIG. 3 illustrates thermoelectric device modules 207, such as modules 207A, 207B of FIG. 2, being connected to a fin 205, such as fin 205A of FIG. 2, in accordance with an embodiment of the present invention.

Returning to FIG. 2, as a result of not including the metal wall, conduction losses that were occurring through the metal wall are eliminated thereby allowing more effective heat transfer between exhaust gas 203 and thermoelectric device modules 207. Furthermore, by eliminating the metal wall, thermal fatigue failures at the bond between the metal wall and the hot-side of the thermoelectric device modules are eliminated. Additionally, as illustrated in FIG. 2, the design of thermoelectric power generator 200, as opposed to conventional thermoelectric power generators, such as shown in FIG. 1, allow for a higher density of thermoelectric device modules 207 in a given thermoelectric power generator volume thereby allowing for greater electric power production for a given generator volume or size. In addition, the design of thermoelectric power generator 200, as opposed to conventional thermoelectric power generators, such as shown in FIG. 1, only includes a single housing (element 201) as opposed to multiple housings, such as the three housings (elements 101, 109A, 109B) shown in the conventional thermoelectric power generator of FIG. 1, thereby reducing the cost in manufacturing thermoelectric power generators.

Furthermore, as shown in FIG. 2, a portion of thermoelectric device modules 207 are directly connected to boundary 206. For example, thermoelectric device modules 207M-207S are directly connected to boundary 206 as shown in FIG. 2. In one embodiment, the number of thermoelectric device modules 207 directly coupled to fins 205 corresponds to twice the number of fins 205 in heat exchanger 202 (two thermoelectric device modules 207 per fin 205). Thermoelectric power generator 200 of the present invention may include any number of thermoelectric device modules 207 and is not to be limited in scope to the depicted number of thermoelectric device modules 207 shown in FIG. 2.

Figure 4:
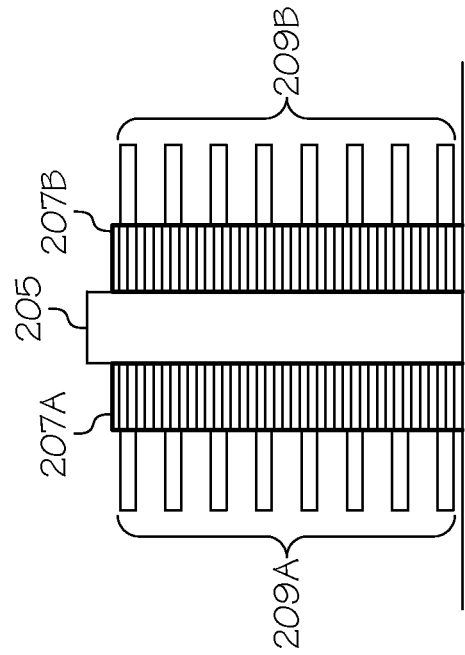
FIG. 4 illustrates a second set of fins being integrated with the thermoelectric module housing on the hot-side of the thermoelectric device modules which are connected to a fin in accordance with an embodiment of the present invention.

To assist in the conversion of thermal energy to electrical energy, additional fins 209A-209S are attached to or are integrated with the thermoelectric module housing on the hot-side of each thermoelectric device module 207A-207S, respectively. Fins 209A-209S may collectively or individually be referred to as fins 209 or fin 209, respectively. A close-up view of fins 209 being integrated with the thermoelectric module housing on the hot-side of thermoelectric device modules 207 is shown in FIG. 4. FIG. 4 illustrates fins 209, such as fins 209A, 209B of FIG. 2, being integrated with the thermoelectric module housing on the hot-side of thermoelectric device modules 207, such as modules 207A, 207B of FIG. 2, which are connected to a fin 205, such as fin 205A of FIG. 2, in accordance with an embodiment of the present invention. In one embodiment, the hot-side ceramic of thermoelectric device modules 207 may be contoured or textured in a shape that enhances heat transfer as opposed to being a simple flat ceramic.

Returning to FIG. 2, in one embodiment, fins 209 are comprised of ceramic material. In one embodiment, fins 209 aid in extracting more thermal energy from exhaust gas stream 203 thereby increasing the amount of electrical energy that is produced by thermoelectric device modules 207.

Additionally, thermoelectric power generator 200 includes a series of holes 210A-210T for cooling water which is used to transfer the thermal energy from thermoelectric device modules 207 to a liquid coolant (e.g., water). Holes 210A-210T may collectively or individually be referred to as holes 210 or hole 210, respectively. Each hole 210 may be designed in a circular shape or in other shapes, such as rectangular. The principles of the present invention are not to be limited in scope to the shape of holes 210 depicted in FIG. 2.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A thermoelectric power generator, comprising:
   a heat exchanger configured to extract thermal energy from an exhaust gas stream, wherein said heat exchanger comprises:
      a first plurality of fins in direct contact with a first portion of a boundary of said heat exchanger, wherein said first plurality of fins are directly connected to a first plurality of thermoelectric device modules, wherein a second portion of said boundary of said heat exchanger is located between said first plurality of fins, wherein said first plurality of fins comprises all fins directly attached to said boundary of said heat exchanger; and
      a second plurality of thermoelectric device modules directly connected to a portion of said second portion of said boundary of said heat exchanger;
   wherein said first and second plurality of thermoelectric device modules are configured to convert said thermal energy to electrical energy.

2. The thermoelectric power generator as recited in claim 1, wherein a cold-side of said first plurality of thermoelectric device modules are directly connected to said first plurality of fins, wherein a cold-side of said second plurality of thermoelectric device modules are directly connected to said portion of said second portion of said boundary of said heat exchanger.

3. The thermoelectric power generator as recited in claim 1, wherein a number of said first plurality of thermoelectric device modules corresponds to twice a number of said first plurality of fins.

4. The thermoelectric power generator as recited in claim 1, wherein said first plurality of fins are comprised of aluminum material.

5. The thermoelectric power generator as recited in claim 1 further comprises:
   a second plurality of fins, wherein each of said second plurality of fins is connected to one of said first plurality of thermoelectric device modules.

6. The thermoelectric power generator as recited in claim 5, wherein said second plurality of fins are comprised of ceramic material.

7. The thermoelectric power generator as recited in claim 1 further comprising:

a single exhaust housing configured to house said heat exchanger.

8. The thermoelectric power generator as recited in claim 7, wherein said exhaust housing is comprised of extruded aluminum.

9. The thermoelectric power generator as recited in claim 7, wherein a cross section of said exhaust housing is approximately 15 cm×30 cm.

10. The thermoelectric power generator as recited in claim 7 further comprising:
a plurality of holes for cooling water, wherein said plurality of holes are located within said exhaust housing outside of said boundary of said heat exchanger.

11. A thermoelectric power generator system, comprising:
an internal combustion engine configured to generate an exhaust gas stream through an exhaust pipe;
a thermoelectric power generator connected to said internal combustion engine via said exhaust pipe; and
an electrical load connected to said thermoelectric power generator;
wherein said thermoelectric power generator comprises:
a heat exchanger configured to extract thermal energy from said exhaust gas stream, wherein said heat exchanger comprises:
a first plurality of fins in direct contact with a first portion of a boundary of said heat exchanger, wherein said first plurality of fins are directly connected to a first plurality of thermoelectric device modules, wherein a second portion of said boundary of said heat exchanger is located between said first plurality of fins, wherein said first plurality of fins comprises all fins directly attached to said boundary of said heat exchanger; and
a second plurality of thermoelectric device modules directly connected to a portion of said second portion of said boundary of said heat exchanger;
wherein said first and second plurality of thermoelectric device modules are configured to convert said thermal energy to electrical energy.

12. The thermoelectric power generator system as recited in claim 11, wherein said electrical load comprises one of the following: batteries, fans and an electric motor.

13. The thermoelectric power generator system as recited in claim 11, wherein a cold-side of said first plurality of thermoelectric device modules are directly connected to said first plurality of fins, wherein a cold-side of said second plurality of thermoelectric device modules are directly connected to said portion of said second portion of said boundary of said heat exchanger.

14. The thermoelectric power generator system as recited in claim 11, wherein a number of said first plurality of thermoelectric device modules corresponds to twice a number of said first plurality of fins.

15. The thermoelectric power generator system as recited in claim 11, wherein said first plurality of fins are comprised of aluminum material.

16. The thermoelectric power generator system as recited in claim 11 further comprises:
a second plurality of fins, wherein each of said second plurality of fins is connected to one of said first plurality of thermoelectric device modules.

17. The thermoelectric power generator system as recited in claim 16, wherein said second plurality of fins are comprised of ceramic material.

18. The thermoelectric power generator system as recited in claim 11 further comprising:
a single exhaust housing configured to house said heat exchanger.

19. The thermoelectric power generator system as recited in claim 18, wherein said exhaust housing is comprised of extruded aluminum.

20. The thermoelectric power generator system as recited in claim 18, wherein a cross section of said exhaust housing is approximately 15 cm×30 cm.

21. The thermoelectric power generator system as recited in claim 18 further comprising:
a plurality of holes for cooling water, wherein said plurality of holes are located within said exhaust housing outside of said boundary of said heat exchanger.

* * * * *